US011732978B2

(12) United States Patent
Miller et al.

(10) Patent No.: US 11,732,978 B2
(45) Date of Patent: Aug. 22, 2023

(54) LAMINATED MICROCHANNEL HEAT EXCHANGERS

(71) Applicant: OREGON STATE UNIVERSITY, Corvallis, OR (US)

(72) Inventors: Richard Todd Miller, Corvallis, OR (US); Steven Schon, Strafford, PA (US)

(73) Assignee: QCIP Holdings, LLC, Strafford, PA (US)

( * ) Notice: Subject to any disclaimer, the term of this patent is extended or adjusted under 35 U.S.C. 154(b) by 0 days.

(21) Appl. No.: 16/072,501

(22) PCT Filed: Apr. 18, 2017

(86) PCT No.: PCT/US2017/028183
§ 371 (c)(1),
(2) Date: Jul. 24, 2018

(87) PCT Pub. No.: WO2017/184635
PCT Pub. Date: Oct. 26, 2017

(65) Prior Publication Data
US 2019/0063848 A1  Feb. 28, 2019

Related U.S. Application Data

(60) Provisional application No. 62/324,327, filed on Apr. 18, 2016.

(51) Int. Cl.
*F28F 3/08* (2006.01)
*F28F 13/06* (2006.01)
(Continued)

(52) U.S. Cl.
CPC .......... *F28F 3/086* (2013.01); *F28D 15/0233* (2013.01); *F28F 7/02* (2013.01);
(Continued)

(58) Field of Classification Search
CPC .... F28F 3/048; F28F 3/08; F28F 13/02; F28F 13/06; F28F 21/04; F28F 2250/04;
(Continued)

(56) References Cited

U.S. PATENT DOCUMENTS 4,516,632 A * 5/1985 Swift ............... F28D 9/0075
165/166
4,624,305 A * 11/1986 Rojey ............... F28F 3/086
165/165

(Continued)

FOREIGN PATENT DOCUMENTS

| CN | 1158549 | 3/1997 |
|----|---------|--------|
| CN | 1158549 | 9/1997 |

(Continued)

OTHER PUBLICATIONS

International Search Report and Written Opinion, PCT/US 2017/028183, dated Aug. 24, 2017.

(Continued)

*Primary Examiner* — Joel M Attey
(74) *Attorney, Agent, or Firm* — Kristofer E. Elbing

(57) ABSTRACT

In one general aspect, a microchannel heat exchanger is disclosed. It includes a cover, a base, and thermally conductive sheets between the cover and the base that each define a series of side-by-side lanes aligned with a flow direction. The lanes each include aligned slots that define microchannel segments and are separated by cross ribs. The sheets are stacked between the base and cover so as to cause at least some of the ribs to be offset from each other and allow the microchannel segments in the same lane in adjacent sheets to communicate with each other along the flow direction to define a plurality of microchannels in the heat exchanger.

20 Claims, 9 Drawing Sheets

(51) Int. Cl.
| | |
|---|---|
| *F28D 15/02* | (2006.01) |
| *F28F 7/02* | (2006.01) |
| *F28D 21/00* | (2006.01) |
| *F28F 13/02* | (2006.01) |
| *H01L 23/473* | (2006.01) |
| *F28D 9/00* | (2006.01) |
| *F28F 21/04* | (2006.01) |
| *F28F 3/04* | (2006.01) |

(52) U.S. Cl.
CPC ............ *F28F 13/06* (2013.01); *F28D 9/0081* (2013.01); *F28D 2021/0028* (2013.01); *F28F 3/048* (2013.01); *F28F 3/08* (2013.01); *F28F 13/02* (2013.01); *F28F 21/04* (2013.01); *F28F 2250/04* (2013.01); *F28F 2250/10* (2013.01); *F28F 2255/18* (2013.01); *F28F 2260/02* (2013.01); *F28F 2265/24* (2013.01); *H01L 23/473* (2013.01)

(58) Field of Classification Search
CPC ............... F28F 2250/10; F28F 2255/18; F28F 2260/02; F28F 3/086; F28F 7/02; F28F 2265/24; F28D 9/0081; F28D 15/0233; F28D 2021/0028; H01L 23/473
See application file for complete search history.

(56) References Cited

U.S. PATENT DOCUMENTS

| | | | | |
|---|---|---|---|---|
| 5,133,403 | A * | 7/1992 | Yokono | H01L 23/3733 |
| | | | | 165/185 |
| 5,193,611 | A * | 3/1993 | Hesselgreaves | F28F 3/02 |
| | | | | 165/165 |
| 5,212,004 | A * | 5/1993 | Bottcher | F28F 3/086 |
| | | | | 165/166 |
| 5,423,376 | A | 6/1995 | Julien | |
| 5,429,177 | A * | 7/1995 | Yaron | F02G 1/0445 |
| | | | | 165/10 |
| 6,446,442 | B1 * | 9/2002 | Batchelor | F25B 21/02 |
| | | | | 62/259.2 |
| 6,634,421 | B2 | 10/2003 | Ognibene | |
| 6,923,013 | B2 * | 8/2005 | Chiang | A47F 3/0447 |
| | | | | 62/255 |
| 7,584,781 | B2 * | 9/2009 | Lai | F28F 3/086 |
| | | | | 165/166 |
| 7,836,597 | B2 * | 11/2010 | Datta | F28D 15/0266 |
| | | | | 29/890.041 |
| 9,275,931 | B2 * | 3/2016 | Chen | H01L 23/473 |
| 9,310,135 | B1 | 4/2016 | Farber et al. | |
| 2001/0035285 | A1 | 11/2001 | Ognibene et al. | |
| 2004/0190253 | A1 * | 9/2004 | Prasher | F28D 15/0233 |
| | | | | 361/699 |
| 2005/0189342 | A1 | 1/2005 | Kabbani | |
| 2007/0084585 | A1 | 4/2007 | Takagi et al. | |
| 2009/0283244 | A1 | 11/2009 | Bezama et al. | |
| 2015/0047619 | A1 * | 2/2015 | Fetzer | F28D 21/0003 |
| | | | | 165/143 |
| 2016/0319804 | A1 * | 11/2016 | Hyde | F24S 20/20 |

FOREIGN PATENT DOCUMENTS

| | | |
|---|---|---|
| CN | 102003899 A | 4/2001 |
| CN | 100584169 C | 1/2010 |
| CN | 201830605 U | 5/2011 |
| CN | 20189741 | 7/2011 |
| FR | 2763204 | 11/1998 |
| WO | 2017184635 | 10/2016 |

OTHER PUBLICATIONS

Second Office Action w/translation, Chinese Patent Application No. CN201780037866, dated Oct. 29, 2020.
First Office Action w/translation, Chinese Patent Application No. CN201780037866, dated Feb. 10, 2020.
Search Report, Chinese Patent Application No. CN201780037866, dated Feb. 4, 2020.
Amendment, EP17786489, dated Jun. 29, 2020.
Extended European Search Report, EP17786489, dated Nov. 28, 2019.
Office Action and Search Report w/translation, Taiwanese Patent Application No. 106112876, dated Jun. 21, 2020.
Examination Report, Indian Patent Application No. 201817042396, dated Oct. 28, 2020.
Simulation of Two-Phase Flow and Heat Transfer for Practical Design of Mini- and Micro-Channel Heat Exchangers, Proceedings of the ASME 2011 International Mechanical Engineering Congress & Exposition, IMECE 2011-63637 (Nov. 11-17, 2011).
And Simulation of Two-Phase Flow and Heat Transfer in Mini- and Micro-Channels for Concentrating Photovoltaics Cooling, Proceedings of the ASME 2011 5th International Conference on Energy Sustainability, ES2011-54206 (Aug. 7-10, 2011).
Notification to Grant Patent Right for Invention (PCT) w/translation, Chinese Patent Application No. CN201780037866, dated Feb. 8, 2022.
Office Action w/translation, Chinese Patent Application No. CN201780037866, dated Sep. 1, 2021.
Request for the Submission of an Opinion w/translation, Korean Patent Application No. KR20187033234, dated Jun. 28, 2021.
Amendment w/translation, Korean Patent Application No. KR20187033234, dated Dec. 28, 2021.
Written Opinion w/translation, Korean Patent Application No. KR20187033234, dated Dec. 28, 2021.
Office Action w/translation, Korean Patent Application No. KR20187033234, dated May 23, 2022.
Office Action w/translation, Taiwanese Patent Application No. KR20187033234, dated Sep. 13, 2021.

* cited by examiner

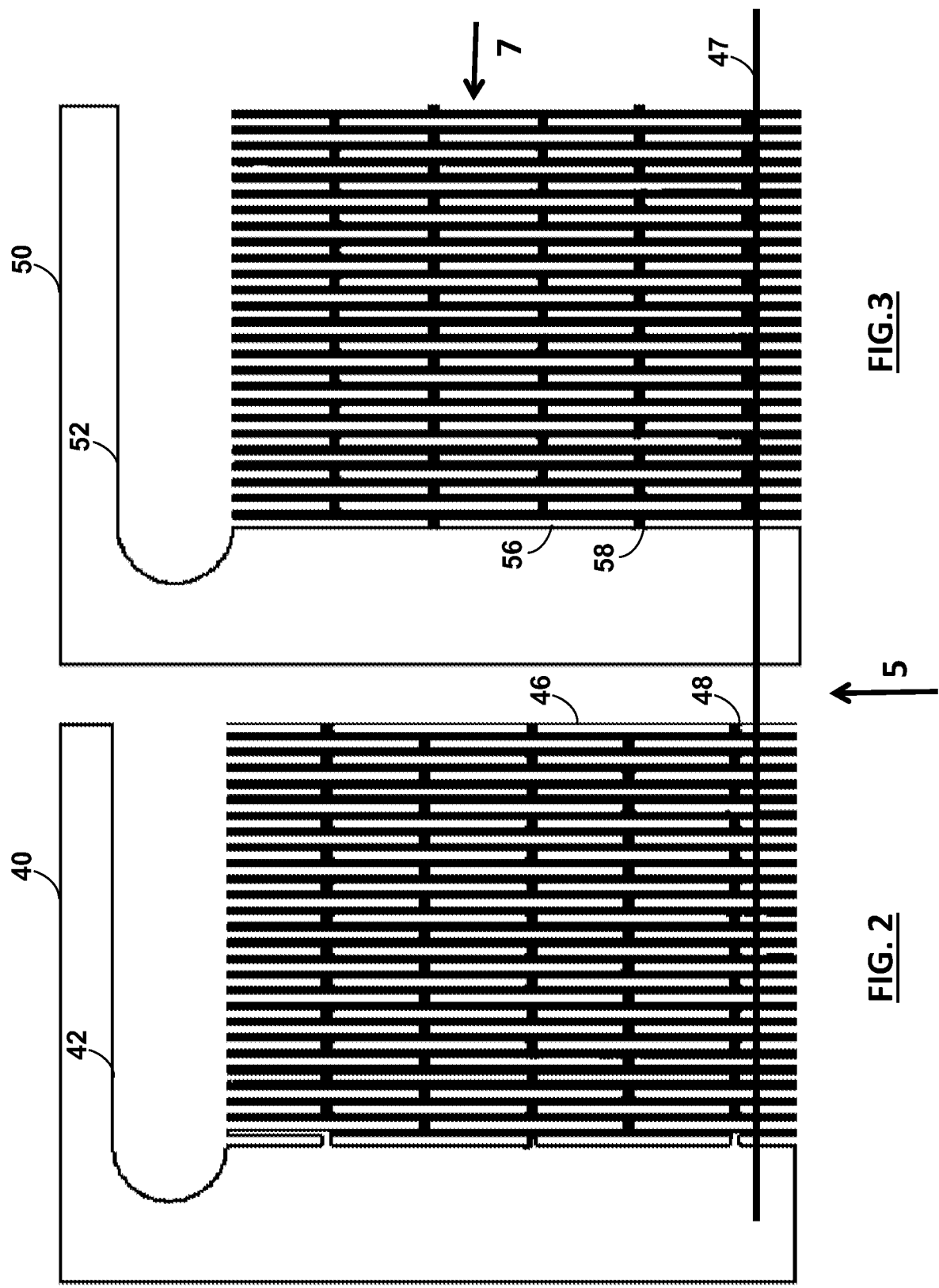

LAMINATED MICROCHANNEL HEAT EXCHANGERS

CROSS-REFERENCE TO RELATED APPLICATION

This application claims priority to U.S. provisional application Ser. No. 62/324,327, filed Apr. 18, 2016, and U.S. application Ser. No. 15/402,511, filed Jan. 10, 2017, which are both herein incorporated by reference.

FIELD OF THE INVENTION

This invention relates to microchannel-based heat exchangers, including microchannel-based evaporators used to cool heat sources with high heat fluxes such as electronic devices.

BACKGROUND OF THE INVENTION

Fluid heat exchangers are used to remove waste heat from high-heat flux heat sources (typically in excess of 5 watts/$cm^2$, and often substantially higher) by accepting and dissipating thermal energy therefrom. Examples of such high-heat flux heat sources include microelectronics, such as microprocessors and memory devices, solid-state light emitting diodes (LEDs) and lasers, insulated-gate bipolar transistor (IGBT) devices, such as power supplies, photovoltaic cells, radioactive thermal generators and fuel rods, and internal combustion engines.

The fluid heat exchangers dissipate heat by thermally conducting the heat into internal passages of the exchanger, through which a coolant fluid flows, absorbing the heat conducted across the walls of the exchanger, and then transporting the fluid outside the exchanger, where the heat is rejected to an external heat sink. While the coolant fluid flowing through the exchanger may be a gas, it is generally preferable to use a liquid, as liquids have higher heat capacities and heat transfer coefficients than gases. The liquid may remain in a single phase, or the liquid may partially or completely evaporate within the internal passages of the exchanger.

The flow of coolant liquid fed to the fluid heat exchanger may be driven by a pump, or by natural convection due to density differences and/or elevation between the incoming and exiting fluid (e.g. thermosyphons), or by capillary action in the internal passages of the exchanger, or by a combination of these mechanisms.

Evaporator-type exchangers rely on the boiling mode, and have the advantages of higher heat transfer coefficients (better heat transfer) per unit of fluid flow rate of the coolant fluid. They also require much less coolant flow, as the majority of the heat is absorbed through via the latent heat of vaporization of the boiling fluid, rather than the sensible heat (heat capacity) of a single-phase liquid or gas.

It is well known that the thermal performance and efficiency of fluid heat exchangers can be greatly enhanced if the internal passages are comprised of microchannels, i.e. channels having cross-sections with a smallest dimension of less than 1000 microns, and more typically, in the range of 50-500 microns.

SUMMARY OF THE INVENTION

In one general aspect, the invention features a microchannel heat exchanger that includes a cover, a base, and thermally conductive sheets between the cover and the base that each define a series of side-by-side lanes aligned with a flow direction. The lanes each include aligned slots that define microchannel segments and are separated by cross ribs. The sheets are stacked between the base and cover so as to cause at least some of the ribs to be offset from each other and allow the microchannel segments in the same lane in adjacent sheets to communicate with each other along the flow direction to define a plurality of microchannels in the heat exchanger.

In preferred embodiments, the thermally conductive sheets can further define access channel openings at each end of the lanes, which when stacked create access channels for the microchannels. The sheets can define a more dense packing of cross ribs in at least one inlet end of the heat exchanger to reduce the open cross-section at the inlet end of the lanes. The aspect ratio of the microchannels can be above 4:1. The aspect ratio of the microchannels can be above 8:1. The apparatus can further include thermally conductive separator sheets located between groups of the thermally conductive sheets to form a multilayer heat exchanger. The sheets can be made of at least one conductive metal. The sheets can be made of sinterable thermally conductive ceramics. The sheets can be bonded or fused. The microchannels can have a hydraulic diameter of below 500 microns. The microchannels can have a hydraulic diameter of below 200 microns. The base can be a base plate that is thicker than each of the sheets and the cover can include access channels in communication with the microchannels. The base can be thermally conductive yet electrically insulating. The heat exchanger can be constructed for boiling or evaporating fluid service, with the heat exchanger further including flow restrictors at the inlet ends of the microchannels. The flow restrictors can be formed by alternately closing an end of the first slot in a lane of slots with cross-ribs that are wider than the bulk of the cross-ribs between slots, with the alternating closed-ended lanes of slots being staggered with respect to the lanes of slots above or below, in alternating layers of slotted sheets, such that, when the sheets are stacked and bonded together, the cross-section of the parallel channels that are formed have a checkerboard pattern across the inlets of the plurality of channels, which serve as integral flow restrictors covering substantially 50% of a cross-sectional area of the main channels.

Systems according to the invention can help to suppress Ledinegg effects and thereby allow heat exchangers to work with two-phase systems. By providing inlet restrictions, microchannel evaporators according to the invention can avoid flow instabilities, due to the Ledinegg effect, whereby boiling within multiple (parallel) microchannels might otherwise be non-uniform and due to the interaction of varying pressure drop as boiling develops in the various channels, resulting in periodic backflow into the inlet header or manifold. This can help to achieve stabilized and substantially uniform boiling flows and thereby result in improved and more stable thermal performance when cooling high-flux heat sources.

BRIEF DESCRIPTION OF THE DRAWING

FIG. 2 is a plan view of a portion of the first type of grooved sheet of FIG. 1 shown in rectangle 2 on FIG. 1;

FIG. 3 is a plan view of a portion of a second type of grooved sheet for inclusion in the grooved laminate structure;

DETAILED DESCRIPTION OF AN ILLUSTRATIVE EMBODIMENT

Figure 1:
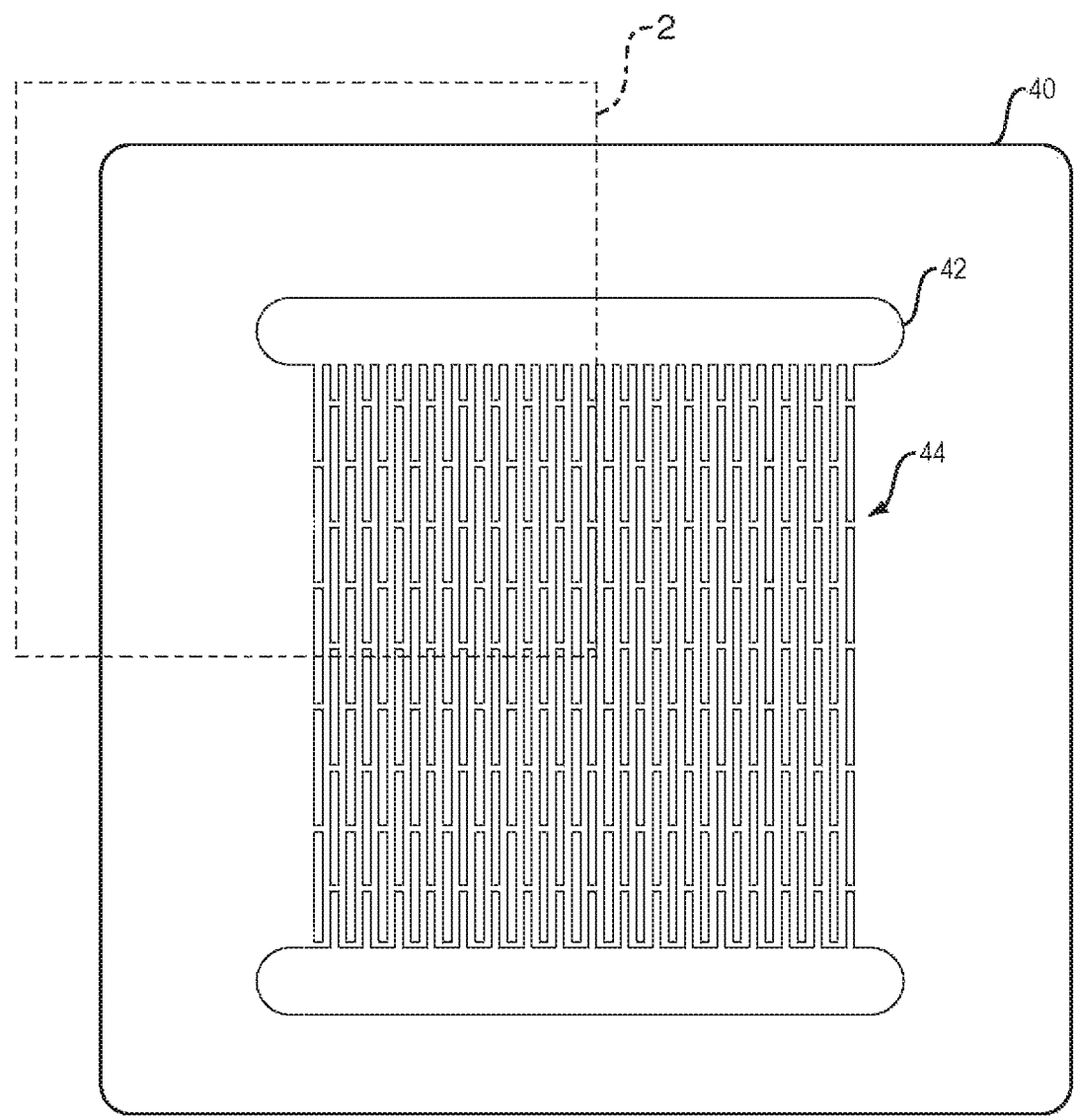
FIG. 1 is a plan view of a first type of grooved sheet for inclusion in a grooved laminate structure that can be used to implement a microchannel heat exchanger.

A microchannel heat exchanger can be assembled using a grooved laminated structure made up of a plurality of thermally conductive sheets. One such sheet of a first type 40 is shown in FIG. 1. It includes common cut-out areas 42 that are separated lines 44 of slots 46 that define the microchannels.

More specifically, the sheet of the first type 40 includes a plurality of lines 44 of multiple slots 46, with the slots in a given line being separated by thin wall that functions as a cross-rib 48. These lines span between the common cut-out areas connected to the slots at either end of each line of slots. The common cut-out areas align with each other to form input and output manifolds when sheets are stacked.

Figure 5:
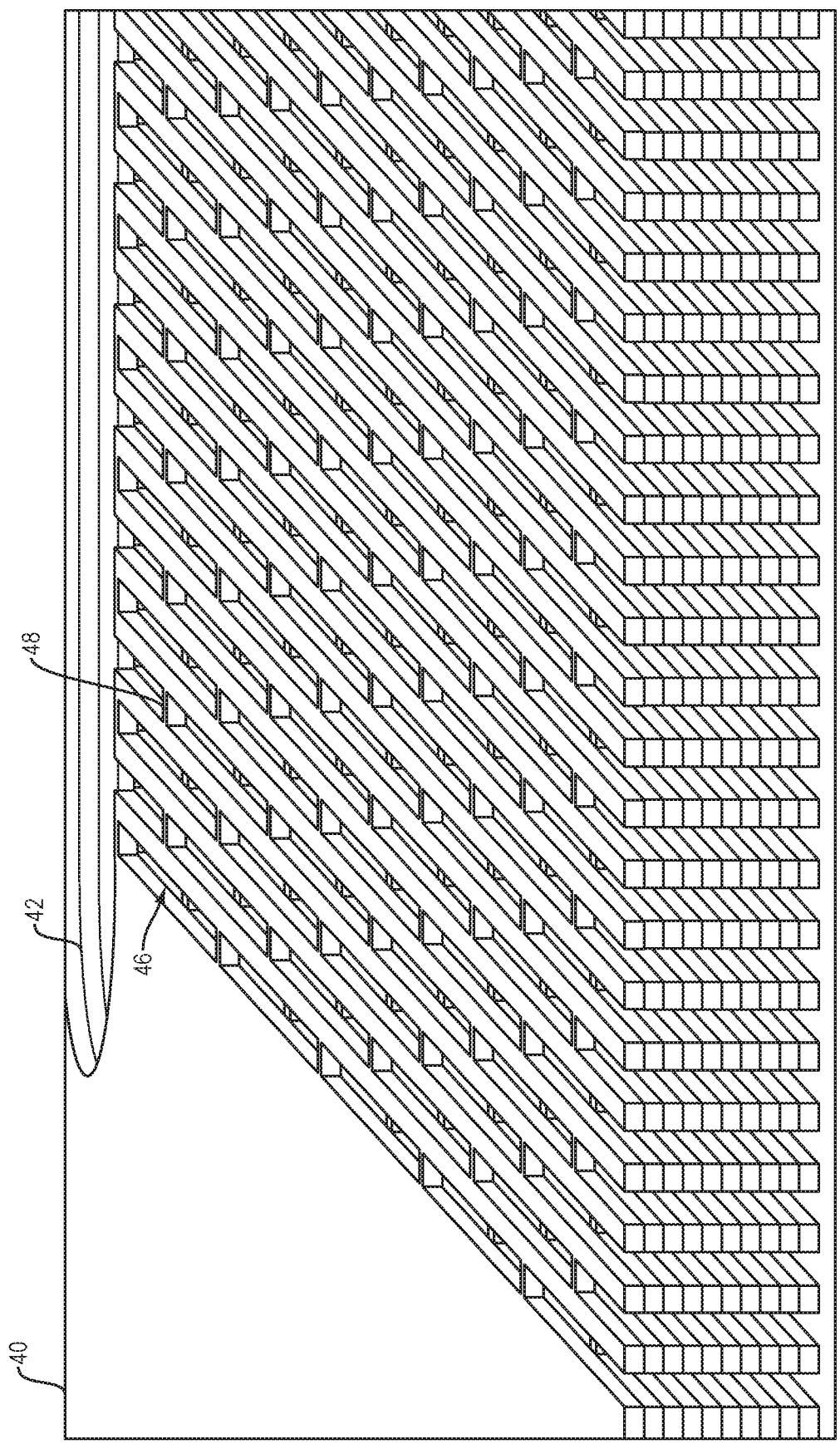
FIG. 5 is a perspective cutaway of the laminate structure formed by alternating first and second sheet types as shown FIGS. 1-4 in an orientation shown by arrow 5 in FIGS. 2 and 3.
Figure 6:
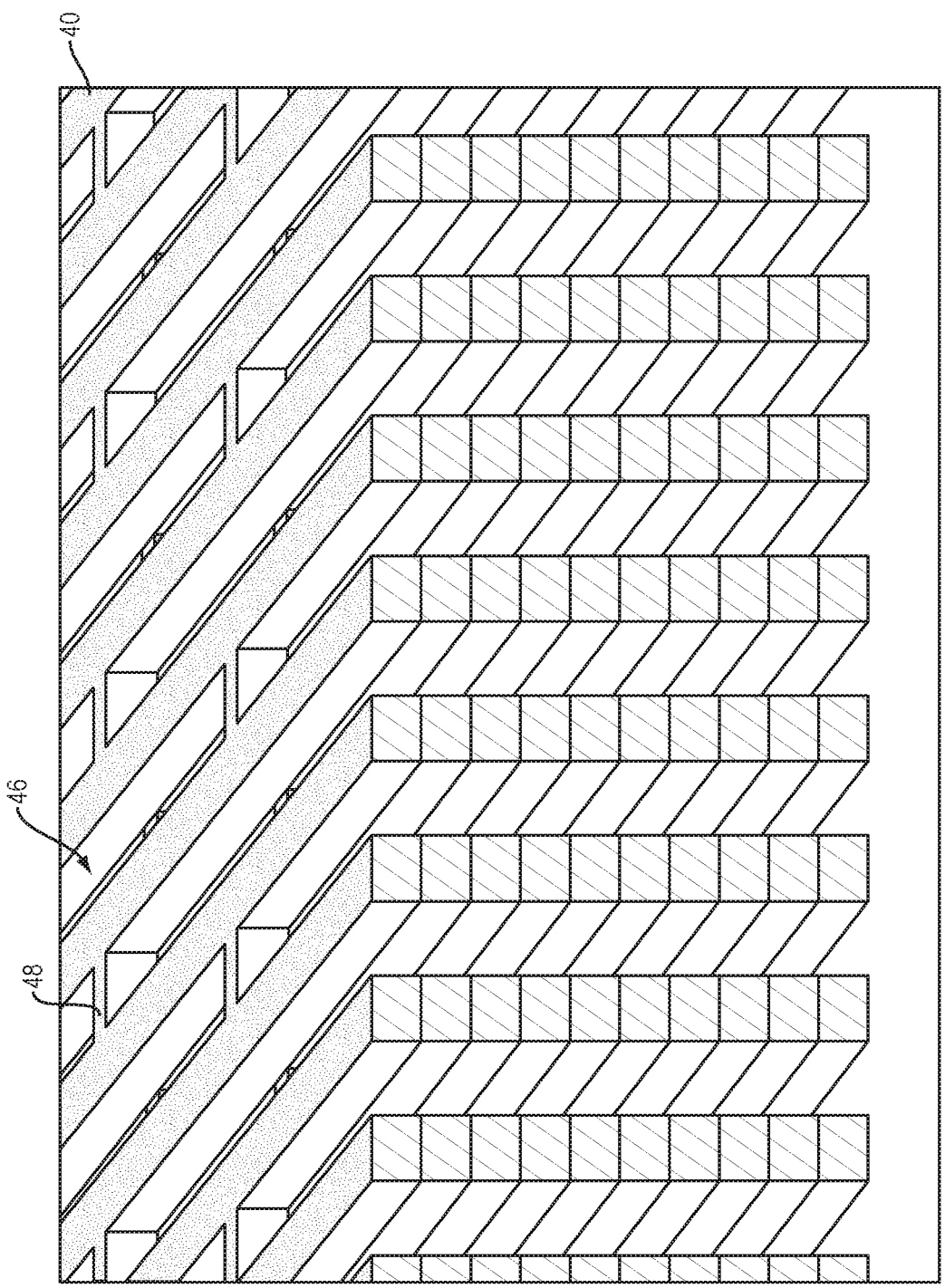
FIG. 6 is a more detailed cutaway view of the grooved laminate structure of FIG. 5.
Figure 7:
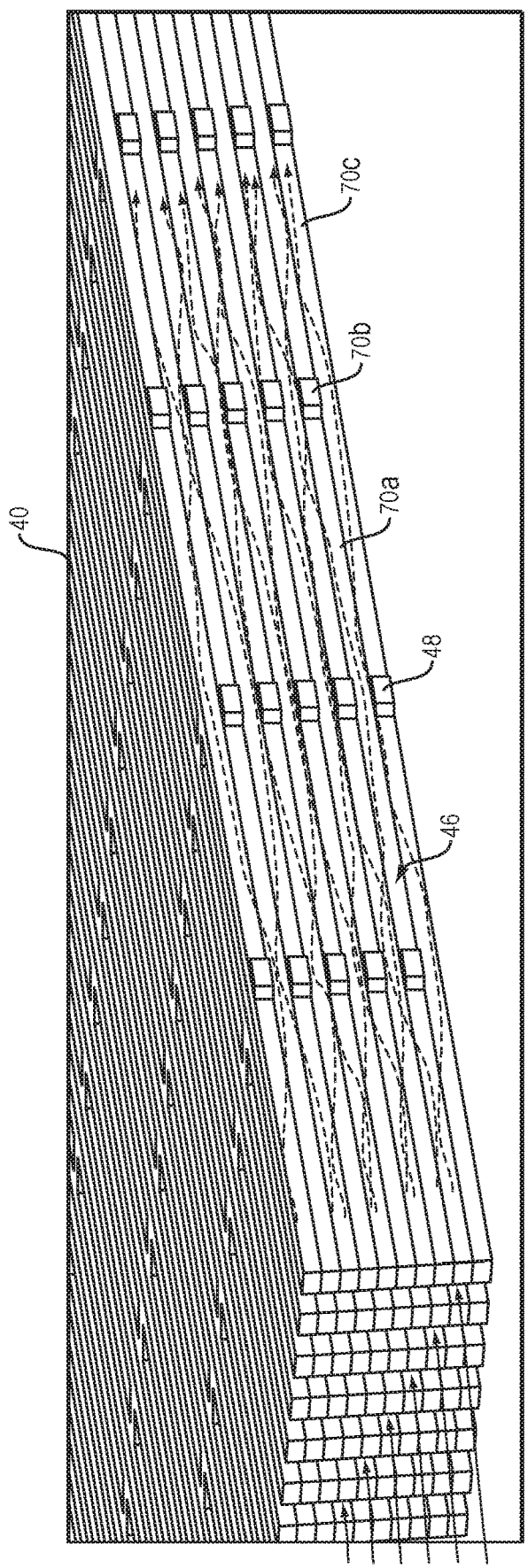
FIG. 7 is a second perspective cutaway of the laminate structure of FIG. 5 showing flow paths through the structure of FIG. 5 in an orientation shown by arrow 7 in FIGS. 2 and 3.

Referring also to FIGS. 2 and 3, alternating two or more types of sheets allows the microchannels to be defined in three-dimensions. In particular, the laminated core structure is assembled by alternating slotted-and-ribbed sheets having the cross-ribs staggered with respect to each other when the sheets are stacked so that each line of slots forms a continuous but serpentine flow path (see also FIGS. 5-7). As shown by reference line 47, the staggered ribs in the different types of sheets are offset with respect to each other along the flow path in this embodiment.

Figure 4:
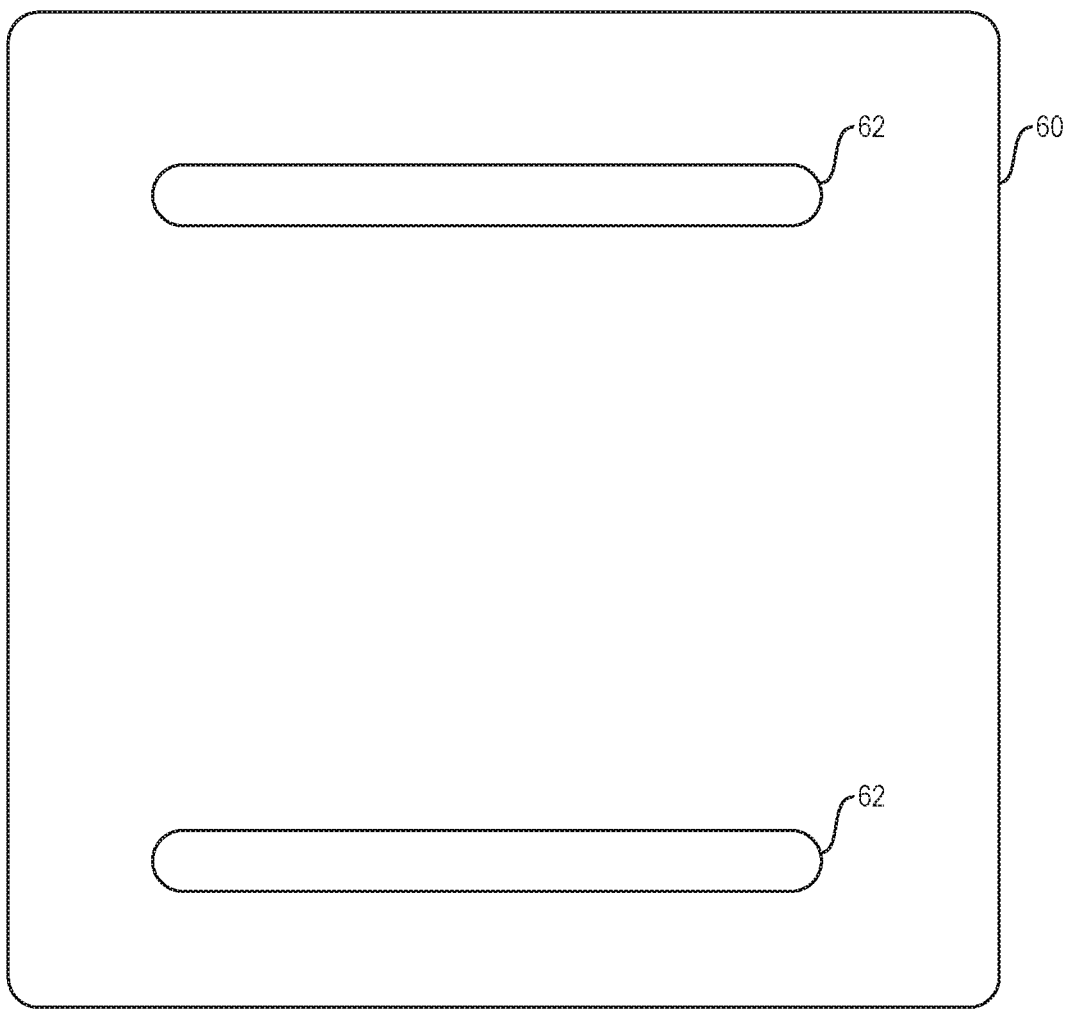
FIG. 4 is a plan view of a separator sheet for inclusion in the grooved laminate structure.

Referring to FIG. 4, thermally conductive un-slotted separator sheets 60 having cut-out areas 62 that align with the common cut-out areas of the slotted-and-ribbed sheets can also be used on the top and bottom of the core and/or to separate layers of microchannels.

Figure 8:
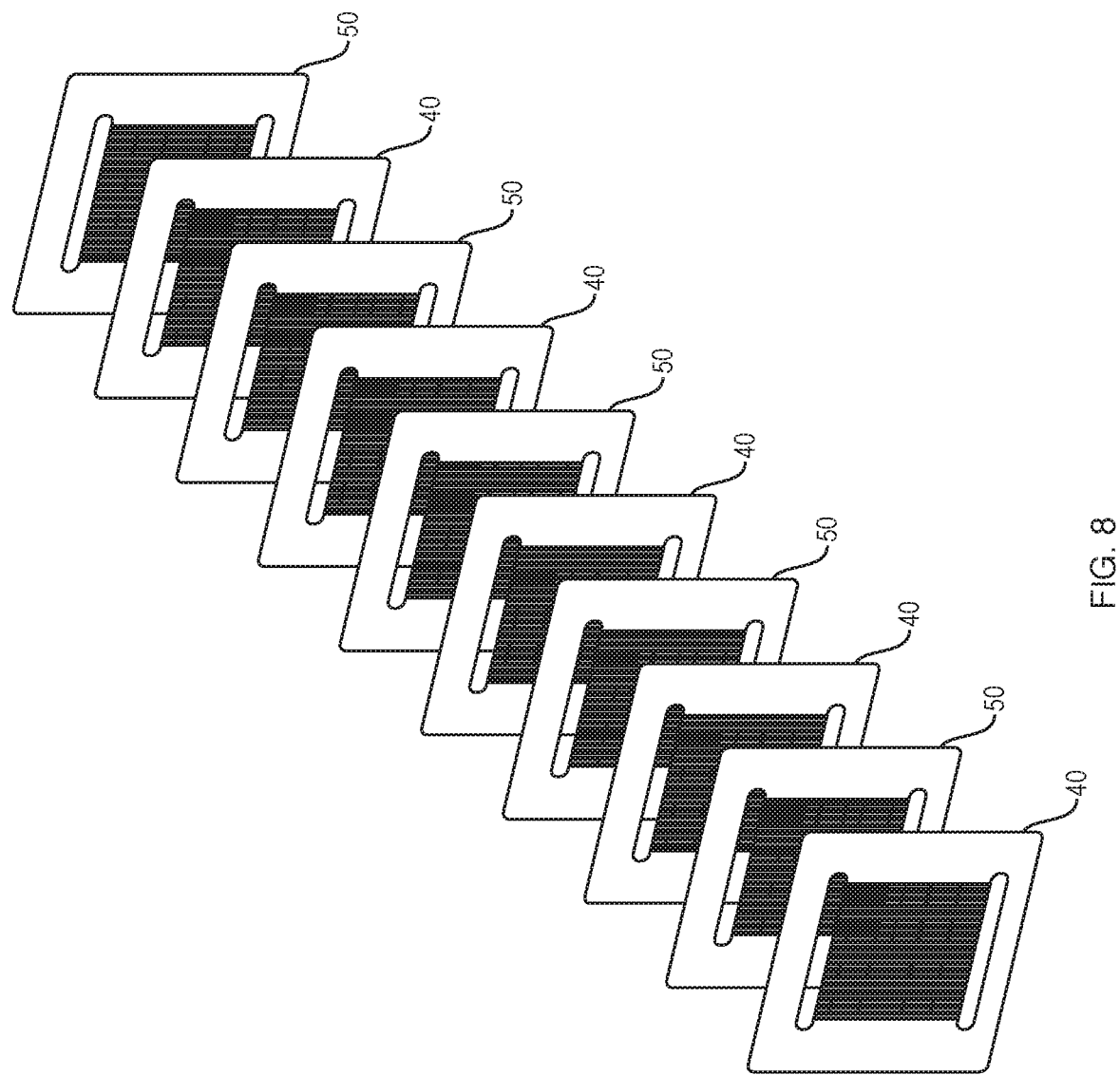
FIG. 8 is an exploded view of the laminated sheets for assembly into a grooved laminate core using the grooved laminated structure presented in FIGS. 1-7.

Referring to FIG. 8, stacking sets of the alternating slotted-and-ribbed-sheets, flanked by un-slotted separator sheets allows the formation of a core structure that includes one or more layers each having a plurality of microchannels with interspersed cross-ribs that intermittently partially interrupt the flow path with providing lateral strengthening of the channel walls. The number of alternating slotted-and-ribbed-sheets in each layer, along with the sheet thickness and slot width, determines the channel depth:width aspect ratio of the channel layers. The layered stacked sheets are preferably bonded to ensure that all the sheets are in thermally conductive communication with each other.

Figure 9:
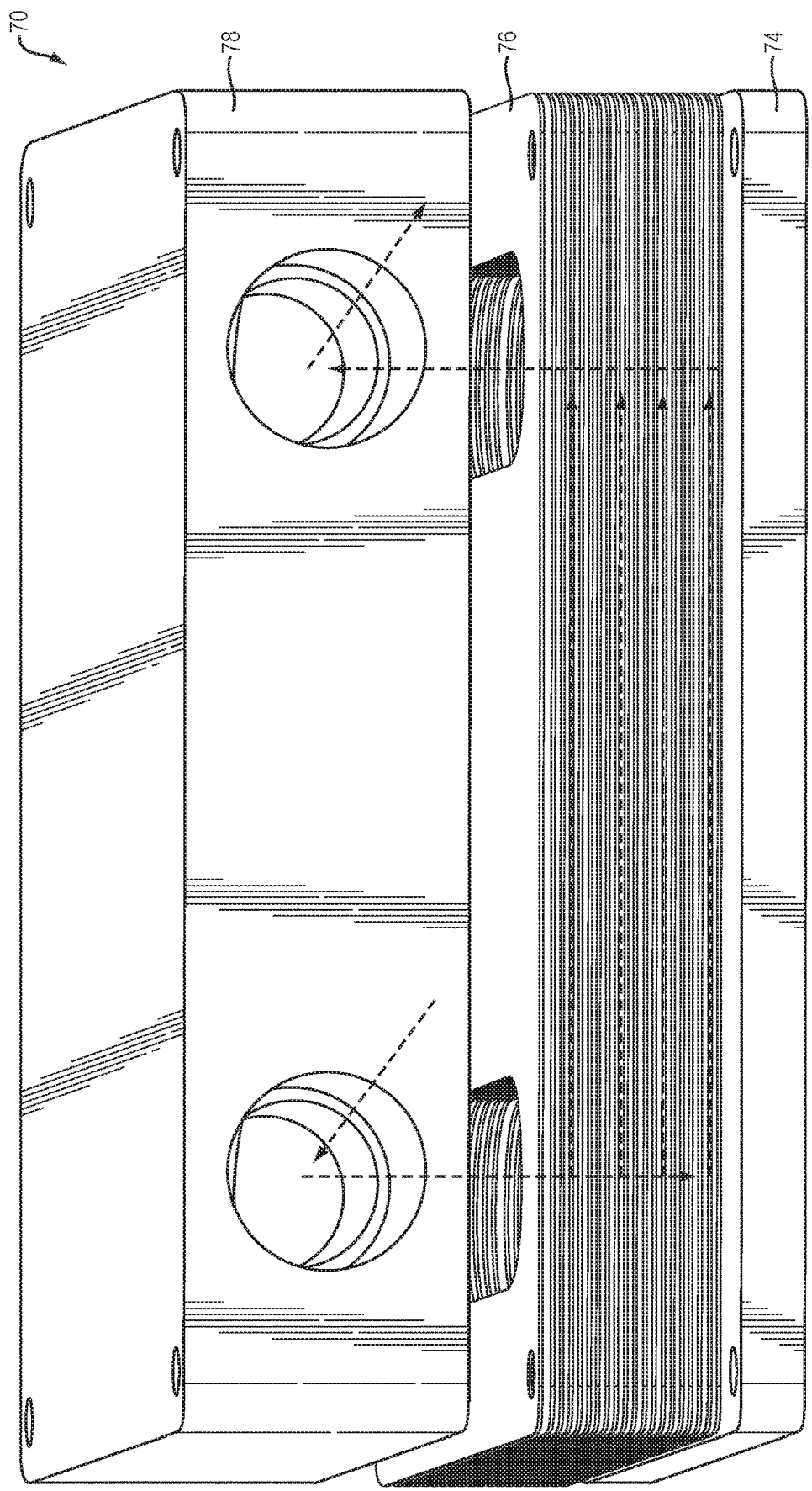
FIG. 9 is an exploded perspective view of a portion of a microchannel heat exchanger using the laminated core of FIG. 8.

Referring to FIG. 9, the resulting sub-assembly can then be bonded to a base plate 74 to ensure that the base plate is in thermally conductive communication with the microchannel layers, and a cover 78 can be placed and sealed on top of the resulting assembly of microchannel layers 76 bonded to the base plate, thereby forming a complete microchannel heat exchanger assembly 70.

Figure 10:
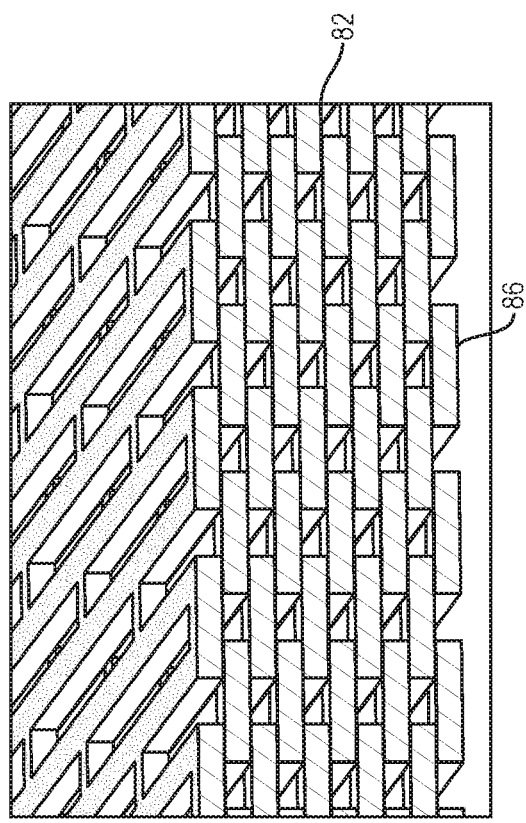
FIG. 10 is a cross-sectional view of the grooved laminate structure of FIG. 5, taken through a plane that defines flow restrictors in the grooved laminate structure.

Referring to FIG. 10, the input sides of the microchannels preferably include flow restrictors where the exchanger is used in boiling or evaporative service. These restrictors can be built into the laminate structure by providing extra cross-ribs 82 at the inputs of the microchannels.

The laminated structures described above enable microchannel heat exchangers having one or more layers of microchannels with hydraulic diameters of less than 500 microns, with the microchannels having arbitrarily high depth:width aspect ratios and with thin walls. The channels have internal cross-ribs connecting the channel's walls, and provide mechanical strength to the channel walls and way of breaking up the fluid stream lines to improve heat transfer. The thermally conductive sheet and base plate materials are preferably, but not limited to, metals and their alloys; non-metallic elements, thermally conductive carbon allotropes, or thermally conductive ceramics. Bonding of the sheets can be by any convenient means that ensure high thermal conduction between the sheets and the base plate.

Multiple layers of microchannels are formed by inserting, between stacks of slotted-and-ribbed sheets, additional thermally conductive un-slotted separator sheets having cut-out areas that align with the common cut-out areas of the slotted-and-ribbed sheets. The microchannels of any layer the may have the same or different depth:width aspect ratio and hydraulic diameter compared to the microchannels in the other layers.

The depth:width aspect ratio of the resulting microchannels can be at least 2:1, and preferably between 4:1 and 15:1. The walls between the resulting microchannels can be less than 200 microns and preferably between 40 and 100 microns thick. The base plate and microchannel walls can be fabricated from materials having thermal conductivities in excess of 100 W/m-K. The hydraulic diameter of the resulting microchannels can be less than 500 microns, and preferably between 50 and 200 microns.

The liquid inlet channels can be provided with flow restrictors, to prevent back-flow or two-phase flow instabilities. These inlet restrictions are provided by closing-off the inlet-side ends of the slots (e.g. by adding additional cross-ribs) of alternate sheets in the stacks of slotted-and-ribbed sheets, thereby reducing the open cross-sectional area of the inlets to the channels relative to the main channel cross-section beyond the closed portions. Preferably, the length of the closed-off (restriction) portions of the microchannels is at least 1 mm.

The various components of the microchannel heat exchanger (e.g. microchannel stacks, base plate, and over plate) can be bonded or fused, so that the exchanger is hermetically sealed (with the exception of the fluid inlet and outlet ports that communicate with the manifolds), so that the exchanger can hold elevated internal pressures. Bonding or fusing may be accomplished by any convenient means.

The various components of the microchannel heat exchanger (e.g. microchannel stacks, base plate, and over plate) can also be held together by mechanical means, with suitable seals between components, so that the exchanger can hold elevated internal pressures.

In another embodiment, the bottom base of the layer of the microchannel exchanger is made from or is coated with a thermally conductive yet electrically insulating ceramic or dielectric solid, such as aluminum nitride, silicon carbide, beryllium oxide, diamond film, and the like. The microchannel exchanger then serves as the substrate for (heat generating) electronic components, which are mounted on, and in thermal contact with, the electrically insulating but thermally conductive underside surface of the exchanger.

Methods of Manufacture

The various components of the microchannel heat exchanger, e.g. the thermally conductive base, the microchannel layers, manifolds, covers, fluid inlet and outlet ports, the slotted-and-ribbed sheets, etc. may be fabricated by any convenient means consistent with the final assembly of the heat exchangers. Such means may include, but are not limited to, the following methods and combinations thereof:

- Subtractive manufacturing techniques such as mechanical machining, milling, etching, punching, photochemical machining, laser ablation or micromachining, electrical discharge machining (EDM), ultrasonic machining, water-jet cutting, etc.
- Mechanical deformation of material, e.g. by skiving, "plowing", stamping, coining, extrusion, etc.
- Laminating and bonding of patterned sheets, to form 3-dimensional structures with internal features and passages. The sheets may have repeating areas of the patterns, so that after bonding, the bonded assemblies may be cut or diced into individual microchannel exchangers or exchanger sub-assemblies.
- Additive manufacturing techniques (3-D printing) as selective laser sintering, direct metal laser sintering, selective laser melting, stereo-lithography, fused deposition modeling, etc.
- Bonding or fusing techniques such diffusion bonding, brazing, soldering, welding, sintering, etc.
- Mechanical assembly techniques such as bolts, studs, clamps, adhesives, and the like, using seals, as appropriate, such as gaskets, O-rings, caulks, etc.

Embodiments according to the invention can be developed for a variety of different cooling configurations and applied to a variety of different cooling tasks. For example, they can implemented in connection with the teachings of published PCT application no. WO2009/085307, filed Dec. 26, 2008 and published US application no. US-2009-0229794, filed on Nov. 10, 2008, which are both herein incorporated by reference.

The present invention has now been described in connection with a number of specific embodiments thereof. However, numerous modifications which are contemplated as falling within the scope of the present invention should now be apparent to those skilled in the art. Therefore, it is intended that the scope of the present invention be limited only by the scope of the claims appended hereto. In addition, the order of presentation of the claims should not be construed to limit the scope of any particular term in the claims.

What is claimed is:

1. A microchannel heat exchanger, comprising:
   a cover with an input access channel and an output access channel,
   a thermally conductive base,
   a plurality of thermally conductive sheets between the cover and the base that each define a series of side-by-side lanes aligned with a flow direction, wherein the lanes each include a plurality of aligned slots that define microchannel segments and are separated by a plurality of cross ribs spaced along the lanes in the flow direction, and wherein the cross-ribs are significantly shorter than the slots in the flow direction,
   wherein the sheets further define common cut-out areas in communication with the lanes at either end of the lanes,
   wherein the thermally conductive sheets include a first plurality of sheets of a first type interleaved with a second plurality of sheets of a second type that are stacked between the base and cover so as to cause at least some of the cross ribs to be offset from each other and allow the microchannel segments in the same lane in adjacent sheets to communicate with each other along the flow direction to define a plurality of microchannels in the heat exchanger, wherein a distance along which the microchannel segments in the same lane in adjacent sheets communicate with each other is significantly longer along the flow direction than the length of the cross ribs between the segments along the flow direction,
   wherein the microchannels defined in the microchannel heat exchanger each has a cross-section with a smallest dimension of less than 1000 microns,
   wherein the sheets are stacked between the base and cover so that the common cut-out areas form at least one input manifold and at least one output manifold that are respectively aligned with the input channel and the output channel on the cover,
   wherein the thermally conductive sheets are bonded or fused to each other to form closed microchannels in the heat exchanger,
   wherein the heat exchanger is constructed for boiling or evaporating fluid service, and wherein the sheets define a more dense packing of cross ribs in the inlet end of each of the lanes of the heat exchanger to reduce the open cross-section at the inlet end of each of the lanes relative to a cross-section of all of a remaining portion of that lane between the more dense packing of cross ribs at the inlet end of that lane and the outlet end of that lane, to define flow restrictors at the inlet end of each of the lanes, and
   wherein the aspect ratio of the microchannels is above 4:1.

2. The apparatus of claim 1 wherein the thermally conductive sheets further define access channel openings at each end of the lanes, which when stacked create access channels for the microchannels.

3. The apparatus of claim 1 wherein the aspect ratio of the microchannels is above 8:1.

4. The apparatus of claim 1 further including thermally conductive separator sheets located between groups of the thermally conductive sheets to form a multilayer heat exchanger.

5. The apparatus of claim 1 wherein the sheets are made of at least one thermally conductive metal.

6. The apparatus of claim 1 wherein the sheets are made of sinterable thermally conductive ceramics.

7. The apparatus of claim 1 wherein the microchannels have a hydraulic diameter of below 500 microns.

8. The apparatus of claim 1 wherein the microchannels have a hydraulic diameter of below 200 microns.

9. The apparatus of claim 1 wherein the base is a base plate that is thicker than each of the sheets and the cover includes access channels in communication with the microchannels.

10. The apparatus of claim 1 wherein the base is thermally conductive yet electrically insulating.

11. The apparatus of claim 1 wherein the flow restrictors are formed by closing an input end of every other lane in each of the sheets with a cross-rib, with the closed-ended lanes of slots being staggered with respect to each other in adjacent sheets when the sheets are stacked and bonded together to form a checkerboard pattern across the inlets of the plurality of channels.

12. The apparatus of claim 11 wherein the checkerboard pattern closes off 50% of a cross-sectional area of the channels.

13. The apparatus of claim 12 wherein the cross-ribs that form flow restrictors are wider than the cross-ribs that are between the slots.

14. The apparatus of claim 11 wherein the cross-ribs that form flow restrictors are wider than the cross-ribs that are between the slots.

15. The apparatus of claim 1 wherein all of the thermally conductive sheets are bonded or fused to each other from the base through to the cover.

16. The apparatus of claim 1 wherein the thermally conductive sheets are bonded or fused to each other using diffusion bonding, brazing, soldering, welding, or sintering.

17. The apparatus of claim 1 wherein the thermally conductive sheets further include at least one unslotted thermally conductive sheet.

18. The apparatus of claim 1 wherein the thermally conductive sheets are bonded or fused to the base.

19. The apparatus of claim 1 further including a boiling coolant inside the heat exchanger.

20. The apparatus of claim 1 wherein the flow restrictors are formed by alternately closing an end of the first slot in a lane of slots with cross-ribs that are wider than the bulk of the cross-ribs between slots, wherein the alternating closed-ended lanes of slots are staggered with respect to the lanes of slots above or below, in alternating layers of slotted sheets, such that, when the sheets are stacked and bonded together, the cross-section of the parallel channels that are formed have a checkerboard pattern accross the inlets of the plurality of channels, which serve as integral flow restrictors covering substantially 50% of a cross-sectional area of the main channels.

\* \* \* \* \*